(12) United States Patent
Morovic et al.

(10) Patent No.: US 10,531,121 B2
(45) Date of Patent: Jan. 7, 2020

(54) SPECTRAL REFLECTANCE COMPRESSION

(71) Applicant: HEWLETT-PACKARD DEVELOPMENT COMPANY, L.P., Houston, TX (US)

(72) Inventors: Peter Morovic, Sant Cugat del Valles (ES); Jan Morovic, Colchester (GB); Jordi Arnabat Benedicto, L'Arboc del Penedes (ES)

(73) Assignee: Hewlett-Packard Development Company, L.P., Spring, TX (US)

( * ) Notice: Subject to any disclaimer, the term of this patent is extended or adjusted under 35 U.S.C. 154(b) by 288 days.

(21) Appl. No.: 15/542,711

(22) PCT Filed: Jan. 30, 2015

(86) PCT No.: PCT/US2015/013820
§ 371 (c)(1),
(2) Date: Jul. 11, 2017

(87) PCT Pub. No.: WO2016/122612
PCT Pub. Date: Aug. 4, 2016

(65) Prior Publication Data
US 2017/0374386 A1    Dec. 28, 2017

(51) Int. Cl.
*G06K 9/36*    (2006.01)
*H04N 19/60*    (2014.01)
(Continued)

(52) U.S. Cl.
CPC .......... *H04N 19/60* (2014.11); *G06K 9/4661* (2013.01); *G06T 9/005* (2013.01); *G06T 9/007* (2013.01);
(Continued)

(58) Field of Classification Search
CPC .. G06K 9/4652; G06K 9/4661; G06K 9/6247; G06K 2009/4657; G06T 9/00;
(Continued)

(56) References Cited

U.S. PATENT DOCUMENTS

| 6,035,057 A | 3/2000 | Hoffman |
| 6,546,146 B1 * | 4/2003 | Hollinger ............... G06T 9/008 |
| | | 382/232 |

(Continued)

FOREIGN PATENT DOCUMENTS

| CN | 103501437 | 1/2014 |
| WO | WO-0072267 | 11/2000 |

(Continued)

OTHER PUBLICATIONS

Agahian, et al., "Spectral Compression: Weighted Principal Component Analysis versus Weighted Least Squares", Human Vision and Electronic. Imaging XIX, vol. 9014, Feb. 3-6, 2014 (http://www.cs.sfu.ca/~funt/.

(Continued)

*Primary Examiner* — Eric Rush
(74) *Attorney, Agent, or Firm* — HP Inc. Patent Department

(57) ABSTRACT

In some examples, a method for compressing a spectral reflectance dataset may be performed through compression circuitry. The method may include computing a principal component analysis basis for the spectral reflectance dataset; projecting the spectral reflectance dataset onto the principal component analysis basis to obtain a weight matrix; quantizing the weight matrix; performing a Huffman encoding process on the quantized weight matrix to generate a Huffman table and Huffman codes for the quantized weight matrix; and providing compressed spectral reflectance data (Continued)

as the principal component analysis basis, the Huffman table, and the Huffman codes.

17 Claims, 5 Drawing Sheets

(51) Int. Cl.

| | | |
|---|---|---|
| *G06K 9/46* | (2006.01) | |
| *H04N 19/134* | (2014.01) | |
| *G06T 9/00* | (2006.01) | |
| *H04N 19/48* | (2014.01) | |
| *H04N 19/103* | (2014.01) | |
| *H03M 7/30* | (2006.01) | |
| *H04N 19/186* | (2014.01) | |
| *H04N 19/91* | (2014.01) | |
| *H04N 19/124* | (2014.01) | |
| *H04N 19/13* | (2014.01) | |
| *H04N 19/162* | (2014.01) | |
| *H04N 19/184* | (2014.01) | |
| *H04N 19/196* | (2014.01) | |
| *G01J 3/42* | (2006.01) | |

(52) U.S. Cl.
CPC ........ *H03M 7/3059* (2013.01); *H04N 19/103* (2014.11); *H04N 19/134* (2014.11); *H04N 19/186* (2014.11); *H04N 19/48* (2014.11); *H04N 19/91* (2014.11); *G01J 3/42* (2013.01); *G01J 2003/425* (2013.01); *H04N 19/124* (2014.11); *H04N 19/13* (2014.11); *H04N 19/162* (2014.11); *H04N 19/184* (2014.11); *H04N 19/196* (2014.11)

(58) Field of Classification Search
CPC ....... G06T 9/005; G06T 9/007; G06T 11/001; G06T 15/50; G06T 15/506; G06T 15/55; H04N 7/127; H04N 19/00; H04N 19/10; H04N 19/102; H04N 19/103; H04N 19/12; H04N 19/122; H04N 19/124; H04N 19/13; H04N 19/134; H04N 19/136; H04N 19/146; H04N 19/157; H04N 19/162; H04N 19/169; H04N 19/17; H04N 19/177; H04N 19/184; H04N 19/186; H04N 19/189; H04N 19/196; H04N 19/48; H04N 19/60; H04N 19/91; H03M 7/00; H03M 7/001; H03M 7/30; H03M 7/3059; H03M 7/3082; H03M 7/40; H03M 7/4006; H03M 7/4012; H03M 7/4018; H03M 7/4031; H03M 7/4093; G01J 3/00; G01J 3/28; G01J 3/42; G01J 2003/425

USPC ....... 382/162, 166, 232, 239, 244–248, 251, 382/253, 276; 341/65, 67, 95, 155; 345/426, 581, 589, 600; 375/240, 240.01, 375/240.02, 240.03, 240.18, 240.22, 375/240.23; 704/201, 222, 229, 230, 500, 704/501; 706/45
See application file for complete search history.

(56) References Cited

U.S. PATENT DOCUMENTS

| | | | | |
|---|---|---|---|---|
| 6,573,890 | B1* | 6/2003 | Lengyel | G06T 9/001 345/418 |
| 6,701,021 | B1* | 3/2004 | Qian | G06T 9/008 382/233 |
| 6,803,910 | B2* | 10/2004 | Pfister | G06T 9/001 382/154 |
| 7,283,684 | B1* | 10/2007 | Keenan | G06K 9/527 382/235 |
| 8,175,375 | B2* | 5/2012 | Bonnery | H04N 19/147 382/160 |
| 8,315,472 | B2* | 11/2012 | Robinson | G06K 9/0063 382/254 |
| 8,432,974 | B2 | 4/2013 | Chen | |
| 8,666,700 | B2 | 3/2014 | Robles-Kelly et al. | |
| 8,675,989 | B2* | 3/2014 | Robinson | G06K 9/46 382/232 |
| 2001/0021271 | A1* | 9/2001 | Ishibashi | G06T 9/007 382/232 |
| 2002/0003903 | A1 | 1/2002 | Engeldrum et al. | |
| 2007/0076969 | A1* | 4/2007 | Lelescu | G06T 9/00 382/248 |
| 2009/0018801 | A1* | 1/2009 | Gladkova | G06T 9/00 703/2 |
| 2013/0110522 | A1 | 5/2013 | Choo et al. | |
| 2013/0223752 | A1* | 8/2013 | Robinson | G06K 9/00201 382/244 |
| 2014/0270561 | A1* | 9/2014 | Matthews | G06T 9/001 382/253 |

FOREIGN PATENT DOCUMENTS

| | | |
|---|---|---|
| WO | WO2013144642 | 10/2013 |
| WO | WO2014012969 | 1/2014 |

OTHER PUBLICATIONS

Fowler, James E., "Compressive-Projection Principal Component Analysis for the Compression of Hyperspectral Signatures", In Proceedings of the IEEE Data Compression Conference, pp. 83-92, Mar. 2008. (http://my.ece.msstate.edu/falulty/fowler/Publications/Papers/Fow2008.pdf) See pp. 82-87.
Shen, et al. Multispectral Image Compression by Cluster-Adaptive Subspace Representation. Sep. 26-29, 2010.

* cited by examiner

SPECTRAL REFLECTANCE COMPRESSION

BACKGROUND

Digital imaging has become increasingly prevalent in recent years. Digital image representation and processing has progressed such that complex imaging techniques are widely used across various facets of society. The amount of data used to represent images is only increasing as display technology advances. Continued advances in imaging will make digital images even more widespread.

BRIEF DESCRIPTION OF THE DRAWINGS

Certain examples are described in the following detailed description and in reference to the drawings.

DETAILED DESCRIPTION

The disclosure below refers to spectral reflectance data. Spectral reflectance data may include any data that indicates the amount of light an object reflects. In particular, spectral reflectance may specify the fraction (or percentage) of incident electromagnetic power that is reflected off an object surface at multiple, various wavelengths. In that regard, spectral reflectance data may indicate a percentage of light that an object may reflect in different lighting conditions, e.g., at various wavelengths of light. Spectral reflectance data may also be referred to as reflectance data or spectral data, and may support rendering of an object or surface for multiple different observers and/or light sources. Spectral reflectance data may be characterized by a spectral sampling interval, which may specify in wavelength units an interval at which discrete data points (e.g., of reflectance) are measured in a spectrum.

Figure 1:
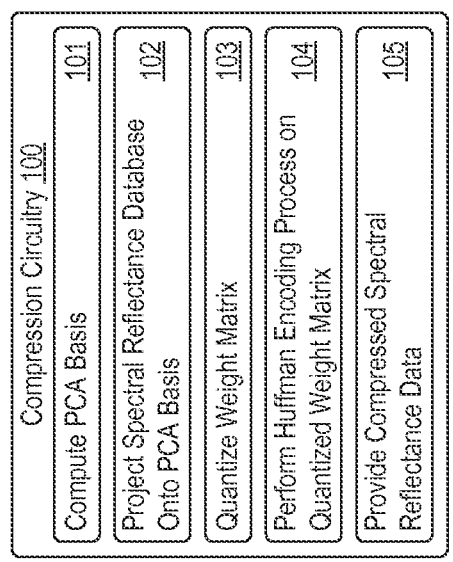
FIG. 1 shows an example of compression circuitry that may compress a spectral reflectance dataset.

FIG. 1 shows an example of compression circuitry 100 that may compress a spectral reflectance dataset. The compression circuitry 100 may include any combination of hardware, circuitry, computer executable instructions, or other components to implement any of the features described herein. In some examples, the compression circuitry 100 includes a processor, a computer readable medium, or both. The computer readable medium may store executable instructions that the processor may execute to perform any of the compression features described herein. In some implementations, the compression circuitry 100 is implemented as part of an image processing system or device.

The compression circuitry 100 may compress spectral reflectance data. In compressing spectral reflectance data, the compression circuitry 100 may encode the spectral reflectance data into a more efficient representation, e.g., a representation with smaller data size. The compression performed by the compression circuitry 100 may, for example, be flexible and adaptive, supporting configurable adjustments with respect to accuracy, speed, throughput, compression ratio, or any other factor. As described below, the compression techniques performed by the compression circuitry 100 may leverage specific facets of spectral reflectance data to achieve increased compression rates while flexibly maintaining accuracy, compression rate, and more. In spectral reflectance data, the compression circuitry 100 may identify and exploit data repetition (e.g., multiple repeated sample values in a spectral reflectance dataset), dimensional redundancy (redundant dimensions in a spectral reflectance dataset represented in a particular dimensionality of sampling points), value frequency (e.g., likelihood of differences in spectral reflectance values, independent of wavelength), and/or implicit wavelength value correlation (e.g., the dependence of spectral reflectance values for neighboring wavelengths in the dataset). Thus, the compression circuitry 100 may increase compression ratios while maintaining a threshold level of accuracy. The greater the size of the initial spectral reflectance data, the greater the compression ratio the compression circuitry 100 may achieve.

The compression circuitry 100 shown in FIG. 1 includes the components labeled 101-105. The components 101-105 may implement features of the compression circuitry 100, for example to compress a spectral reflectance dataset that satisfies a preconfigured accuracy level by computing a principal component analysis (PCA) basis for the spectral reflectance dataset; projecting the spectral reflectance dataset onto the PCA basis computed for the spectral reflectance dataset to obtain a weight matrix; quantizing the weight matrix to obtain a quantized weight matrix; performing a Huffman encoding process on the quantized weight matrix to generate a Huffman table and Huffman codes for the quantized weight matrix; and providing compressed spectral reflectance data as one of the following data combinations with a lesser data size: (i) the PCA basis, the Huffman table, and the Huffman codes; and (ii) the PCA basis and the quantized weight matrix. In some examples, the compression circuitry 100 may further include the quantized spectral reflectance dataset as another data combination that may be selected for providing the compressed spectral reflectance data, e.g., instead of (i) and (ii) above.

Figure 2:
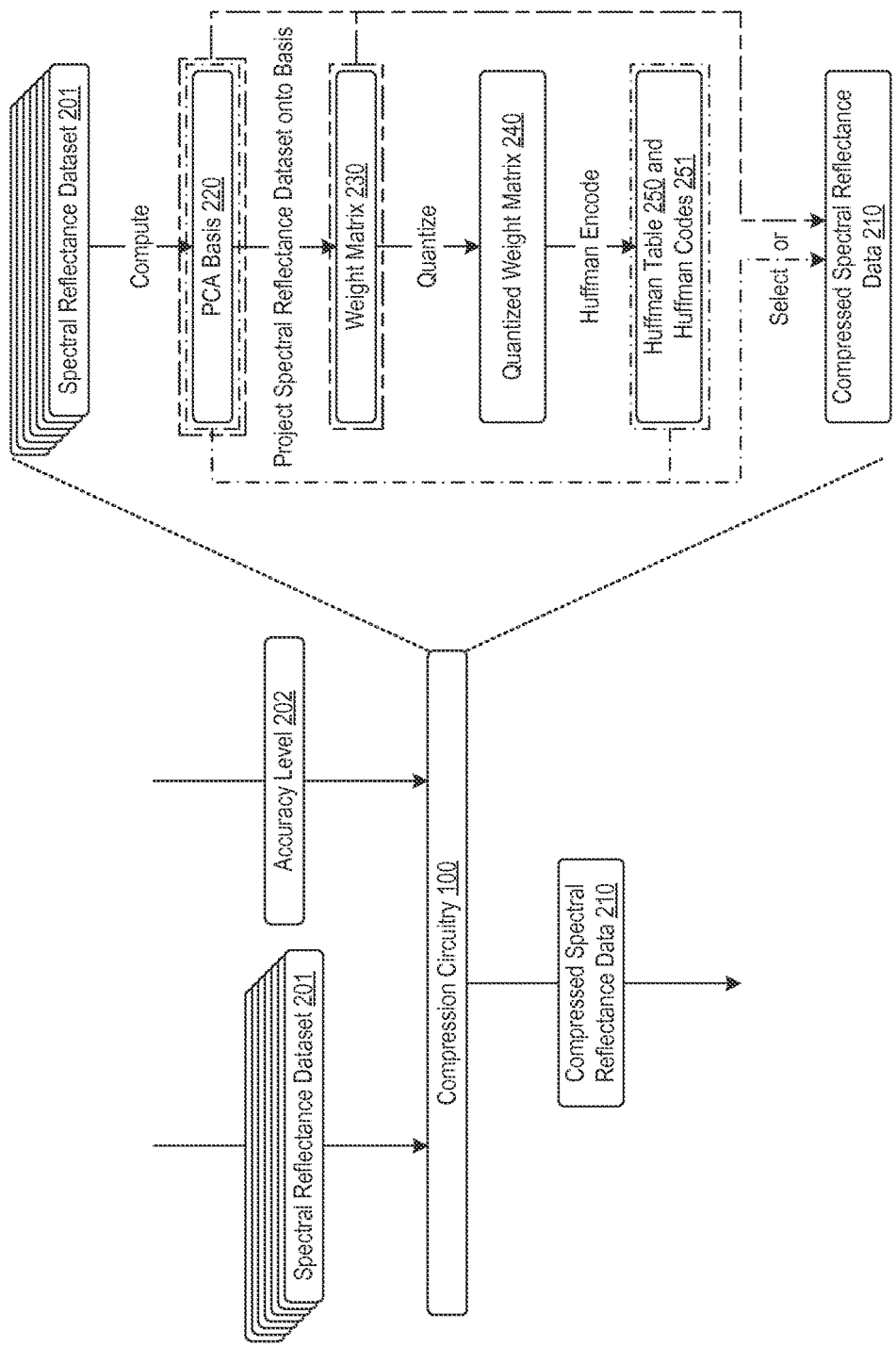
FIG. 2 shows an example of compression techniques that the compression circuitry may perform

Compression features and techniques the compression circuitry 100 may employ are described next. FIG. 2 shows an example of a compression process that the compression circuitry 100 may perform. The compression circuitry 100 may receive a spectral reflectance dataset 201 as an input and provide compressed spectral reflectance data 210 as an out. The compressed spectral reflectance data 210 may be a compressed representation of the spectral reflectance dataset 201.

As some examples, the compression circuitry 100 may access the spectral reflectance dataset 201 from a local or remote memory, from an imaging device measuring spectral reflectance data for an object, or from packet communications received over a communication network. The spectral reflectance dataset 201 may include N reflectance values (e.g., a value corresponding to a pixel, object, or other image portion). Reflectance values in the spectral reflectance dataset 201 may be represented at a depth of M spectral samples. Thus, the spectral reflectance dataset 201 may include an N by M matrix representing N number of spectral values across M dimensions. The number M of spectral samples used to represent a spectral reflectance value may vary depending on the precision a spectrometer or other imaging device captures spectral reflectance data. Example values of M include 16 or 31, which may correspond to a 400 to 700 nanometer (nm) range or a 20 to 10 nm sampling interval.

The compression circuitry 100 may receive an accuracy level 202 and compress the spectral reflectance dataset 201 to satisfy the specified accuracy level 202. The accuracy level 202 may specify a threshold color difference the compressed spectral reflectance data 210 should satisfy. Put another way, the accuracy level 202 may specify a tolerable color difference between the spectral reflectance dataset 201 and the resulting reflectance values when the compressed spectral reflectance data 210 reflectance data 210 is decompressed/decoded. An accuracy level 202 may be expressed through delta E (DE) color distance formulas set forth by the International Commission on Illumination (CIE), such as formulas DE2000 (also referred to as DE00) DE1976, or DE1994. Thus, as one example, the accuracy level 202 may specify that the spectral reflectance values decoded from the compressed spectral reflectance data 210 be accurate within 0.5 (DE00) of the corresponding values in the spectral reflectance dataset 201. As another example, the accuracy level 202 may specify a lossless compression of the spectral reflectance dataset 201 by the compression circuitry 100.

As another example, the accuracy level 202 may be specified according to a Multi-Illuminant Paramer delta E (MIPE) metric. The MIPE metric may track accuracy differences between spectral reflectance values for a set of multiple illuminants. For example, an accuracy level 202 specified according to the MIPE metric may specify that the mean, median, 95th percentile, maximum, minimum, or other selected portion of the delta E differences between spectral values determined for the set of multiple illuminants be within a particular accuracy threshold, where the delta E may be computed using the DE00 formula. Additional examples of accuracy metrics that may be used to specify the accuracy level include the root mean square (RMS) between spectral reflectance values, weight RMS as a function of wavelength, RMS and delta E combined, and more.

The accuracy level 202 may be configurable and set in multiple ways. The compression circuitry 100 may, for example, store a preconfigured or default accuracy level 202 set by a system administrator or other control entity. As other examples, the compression circuitry 100 may receive the accuracy level 202 as a user input, from an imaging device, or from an application specifying a requested precision and accuracy for compressing the spectral reflectance dataset 201. The compression circuitry 100 may thus vary the accuracy threshold at which the spectral reflectance dataset 201 is compressed based on an input indicating a requested accuracy level 202 for which the compression circuitry 100 to process the spectral reflectance dataset 201 or utilize any standard accuracy metric, such as DE or any other accuracy metric used to measure spectral or color matching.

Next, example compression sub-processes that the compression circuitry 100 may perform as part of the compression process to generate the compressed spectral reflectance data 210 are discussed. As noted above, the compression circuitry 100 may leverage dimensional redundancy present in the spectral reflectance dataset 201, and accordingly determine a representation of the spectral reflectance dataset 201 with reduced dimensionality. Dimensionality may refer to the number of dimensions used to represent data.

In some examples, the compression circuitry 100 computes a principal component basis (PCA) basis 220 for the spectral reflectance dataset 201. In computing the PCA basis 220 for the spectral reflectance dataset 201, the compression circuitry 100 may determine a dimensionality O for the PCA basis 220 that meets the accuracy level 202. The dimensionality O determined by the compression circuitry 100 may vary depending on the accuracy level 202. The greater the color difference the accuracy level 202 allows for, the lower the dimensionality O that the compression circuitry 100 may determine, and vice versa. The compression circuitry 100 may determine the PCA basis 220 as an O by M matrix, e.g., with O number of axes in M dimensions. As particular examples, the compression circuitry 100 may determine a dimensionality O for the PCA basis 220 between 10 to 16 dimensions, depending on the redundancy characteristics of the spectral reflectance dataset 201.

The compression circuitry 100 may project the PCA basis 220 onto the spectral reflectance dataset 201. The compression circuitry 100 may do so through matrix projection techniques to apply a linear transformation to the spectral reflectance dataset 201. In projecting the PCA basis 220 onto the spectral reflectance dataset 201, the compression circuitry 110 may obtain a weight matrix 230. As one illustrative example, the compression circuitry may project an N by M matrix (that is the spectral reflectance dataset 201) onto an O-dimensional PCA basis 220 to obtain a N by O matrix (that is the weight matrix 230).

Continuing the discussion of compression sub-processes, the compression circuitry 100 may perform quantization during the compression process of the spectral reflectance dataset 201. In particular, the compression circuitry 100 may quantize the weight matrix 230 to obtain a quantized weight matrix 240. The bit depth at which the compression circuitry 100 performs the quantization to may vary according to the specified accuracy level 202, as more tolerant accuracy levels 202 may support quantization to a lesser bit depth (and thus resulting in a smaller data size for quantized data). The compression circuitry 100 may quantize the weight matrix 230 at a particular bit depth determined to meet the accuracy level 202. In some implementations, the compression circuitry 100 quantizes the weight matrix 230 to a bit depth of 8-16 bits per weight (e.g., per value in the weight matrix 230), though other varying implementations are possible.

The compression circuitry 100 may leverage data repetition and/or value frequency in the spectral reflectance dataset 201 to increase the rate of compression for the compressed spectral reflectance data 210. In some examples, the compression circuitry 100 performs a Huffman encoding process to generate variable length codes for source symbols in a representation of spectral reflectance data. In the example shown in FIG. 2, the compression circuitry 100 performs a Huffman encoding process on the quantized weight matrix 240 to generate a Huffman table 250 and Huffman codes 251 for the quantized weight matrix 240. In that regard, the compression circuitry 100 may represent the quantized weight matrix 240 is a compressed representation through a corresponding Huffman table 250 and Huffman codes 251.

Through the compression process and sub-processes described above, the compression circuitry 100 may generate various compressed representations of the spectral reflectance dataset 201, whether intermediate or as part out of the outputted compressed spectral reflectance data 210. The compression circuitry 100 may select a particular data combination of the compressed representations that represents the spectral reflectance dataset 201 with an increased compression ratio. In the example shown in FIG. 2, the compression circuitry 100 may provide the compressed spectral reflectance data 210 as whichever of the following data combinations the compression circuitry 100 determines to have a lesser data size: (i) the PCA basis 220, the Huffman table 250, and the Huffman codes 251; and (ii) the PCA basis 220 and the weight matrix 230 (or, as another example, the quantized weight matrix 240 instead of the weight matrix 230), though the compression circuitry 100 may also determine to provide the compressed spectral reflectance data 210 through quantizing the spectral reflectance dataset 210 in some implementations as well. As the compression circuitry 100 may provide varying data combinations as the compressed spectral reflectance data 210, the compression circuitry 100 may also provide an indication flag as to which particular data combination is included as the compressed spectral reflectance data 210.

The compression circuitry 100 may perform some or all of the compression sub-processes described above to generate the compressed spectral reflectance data 210. The compression circuitry 100 may vary the order in which the steps are performed, utilizing an ordering that further increases the compression factor of the compressed spectral reflectance data 210. In some implementations, the compression circuitry 100 performs the steps in the example order shown in FIG. 2, specifically: (1) computing the PCA basis 220; (2) projecting the PCA basis 220 onto the spectral reflectance dataset 201 to obtain the weight matrix 230; (3) quantizing the weight matrix 230 to obtain the quantized weight matrix 240; and (4) performing the Huffman encoding process on the quantized weight matrix 240 to generate the Huffman table 250 and the Huffman codes 251.

In processing the spectral reflectance dataset 201 in the above example order, the compression circuitry 100 may leverage the dimensional redundancy, data repetition, value frequency, and wavelength value correlation present in the spectral reflectance dataset 201. In computing the PCA basis 220 earlier in the compression order, the compression circuitry 100 may first reduce the dimensionality and/or leverage value frequency and wavelength value correlation, which may reduce the overall amount of data used to represent the spectral reflectance dataset 201. By performing the quantization and Huffman encoding process later in the compression order, the compression circuitry 100 may further reduce the data size of the representation by leveraging data repetition. As dimensionality reduction may not be possible on a Huffman encoding representation, the compression order discussed above may benefit from both dimensionality reduction and compression benefits resulting from data repetition, which may thus further increase the degree of compression in the compressed spectral reflectance data 210 as compared to other compression sub-process combinations.

Figure 3:
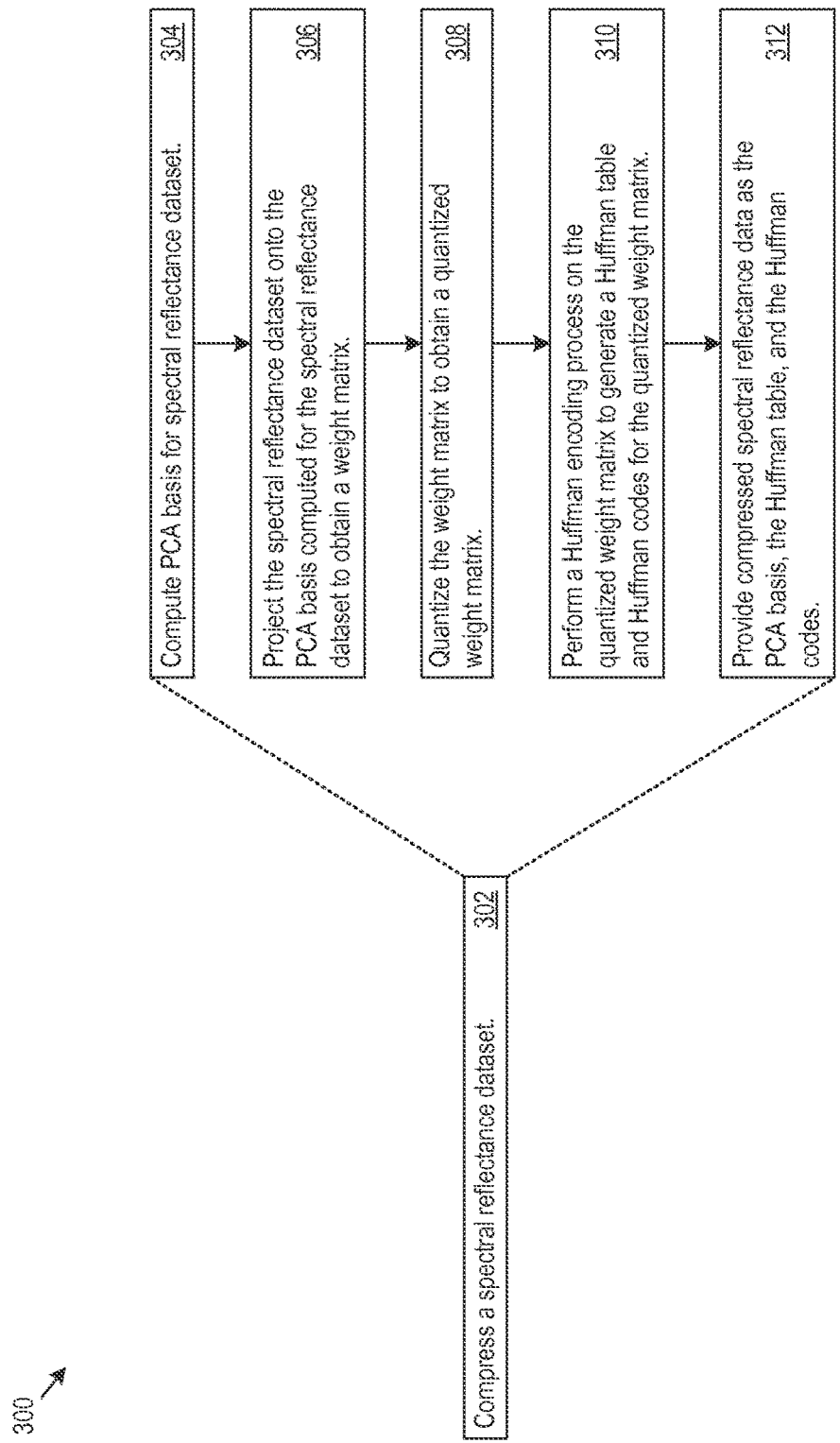
FIG. 3 shows an example of logic that the compression circuitry may implement.

FIG. 3 shows an example of logic 300 that the compression circuitry 100 may implement. The compression circuitry 100 may implement the logic 300 as machine readable instructions, for example. The compression circuitry 100 may compress spectral reflectance dataset 201 (302). The compression circuitry 100 may do so by computing a PCA basis 220 for the spectral reflectance dataset 201 (304) and projecting the spectral reflectance dataset 201 onto the PCA basis 220 to obtain a weight matrix 230 (306). The compression circuitry 100 may quantize the weight matrix 230 to obtain a quantized weight matrix 240 (308) and perform a Huffman encoding process on the quantized weight matrix 240 to generate a Huffman table 250 and Huffman codes 251 for the quantized weight matrix 240 (310). In the example shown in FIG. 3, the compression circuitry 100 may provide (e.g., output) the compressed spectral reflectance data 210 as the PCA basis 220, the Huffman table 250, and the Huffman codes 251.

The compression circuitry 100 may adaptively compress the spectral reflectance dataset 201 to perform some or all of the sub-processes described in FIGS. 2 and 3 above. The compression circuitry 100 may support flexibility in the compression process through varying of a constraint in the compression, such as accuracy, compression ratio, or both. In some examples, the compression circuitry 100 selectively determines whether to apply a compression sub-process described above, according to accuracy criterion, a compression criterion, or both.

As one illustrative example, the compression circuitry 100 may apply both an accuracy criterion and a compression criterion in determining whether to include a compression sub-process as part of the compression process. The accuracy criterion may be satisfied for a particular compression sub-process when, after undoing the particular compression sub-process and previously performed compression sub-processes, the decoded spectral reflectance data satisfies the specified accuracy level 202. Put another way, the accuracy criterion may be satisfied for a particular compression sub-process when the decoded representation of the spectral reflectance data (decoded after having performed the particular compression sub-process) is within a particular color difference from the original spectral reflectance dataset 201 that meets the accuracy level 202. The compression criterion may be satisfied when, for example, the compression ratio between the data size of the spectral reflectance dataset representation after performing the particular compression sub-process and the spectral reflectance dataset representation before performing the particular compression sub-process meets a compression threshold, e.g., is less than one and thus indicating that performing the particular compression sub-process will result in a reduced data size in representing the spectral reflectance dataset 201.

While one illustration has been described above, the compression circuitry 100 may apply any number of additional or other criterion in determining whether or not to include a particular compression sub-process as part of the compression process. Another example of adaptive compression that the compression circuitry 100 may perform is presented next in FIG. 4.

Figure 4:
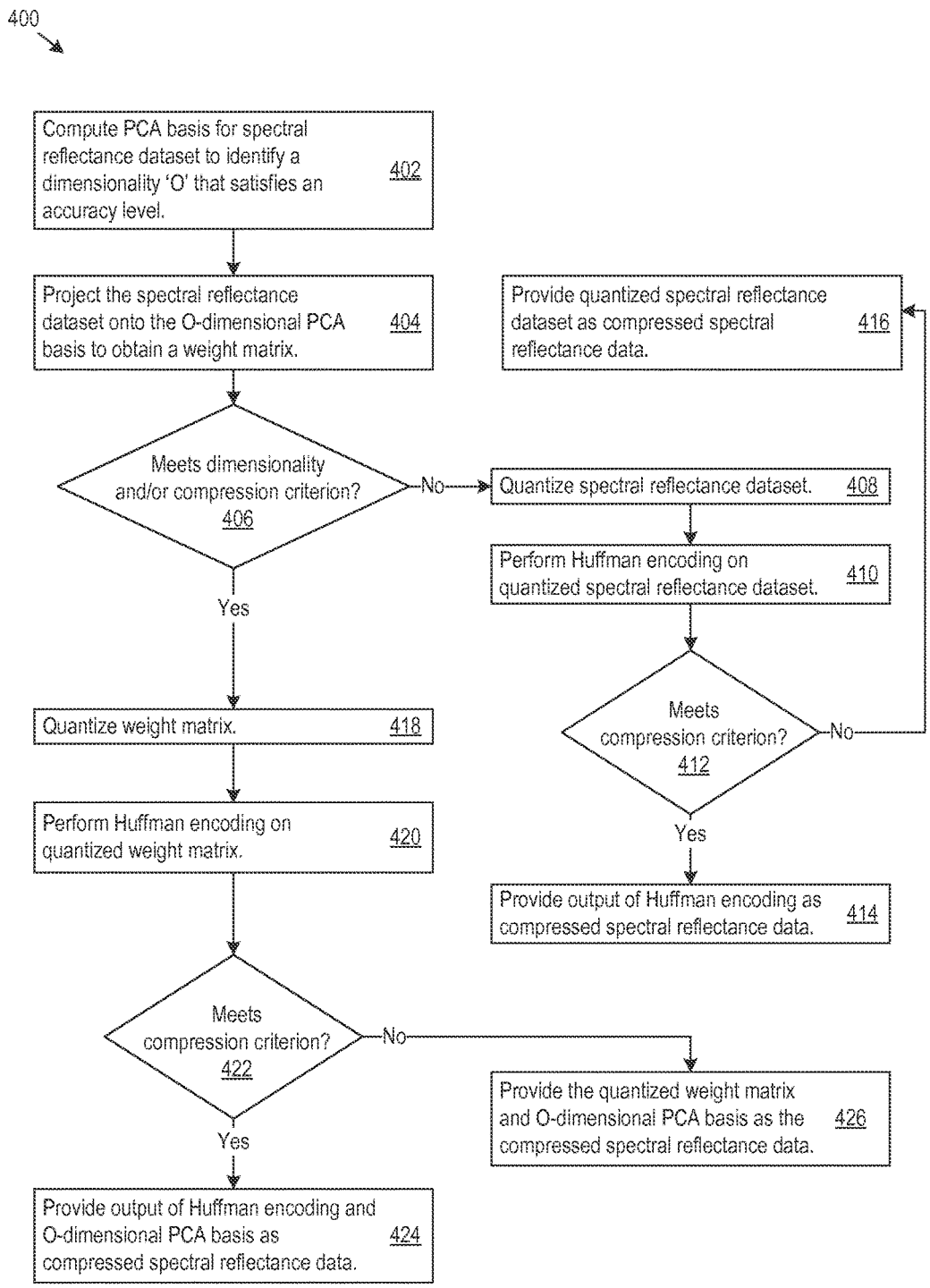
FIG. 4 shows another example of logic that the compression circuitry may implement.

FIG. 4 shows an example of logic 400 that the compression circuitry 100 may implement. The compression circuitry 100 may implement the logic 400 as machine readable instructions, for example. The compression circuitry 100 may access a spectral reflectance dataset 201 and compute PCA basis 220 for the spectral reflectance dataset 201 (402). In doing so, the compression circuitry 100 may identify a dimensionality O for the PCA basis 220 that satisfies the accuracy level 202, which may satisfy the accuracy criterion. The compression circuitry may project the spectral reflectance dataset 201 onto the O-dimensional PCA basis 220 to obtain a weight matrix 230 (404).

The compression circuitry 100 may determine whether the PCA basis 220 with dimensionality O meets a dimensionality criterion, whether the PCA basis 220 dimensionality O and the weight matrix 230 together meet a compression criterion, or both (406). The dimensionality criterion may specify, as one example, that the dimensionality O of the PCA basis 220 be less than the dimensionality of the spectral reflectance dataset 201 or, as another example, less by at least a particular number of dimensions. The compression criterion may be satisfied when the compression ratio for performing computing the PCA basis 220 and weight matrix generation is less than 1, e.g., when the data size of the O-dimensional PCA basis 220 and the weight matrix 230 generated from the O-dimensional PCA basis 220 together is less than the data size of the spectral reflectance dataset 201. Satisfying the compression criterion may indicate that the O-dimensional PCA basis 220 and the weight matrix 230 together is a more data efficient representation of the spectral reflectance dataset 201 than the spectral reflectance dataset itself 201.

When the O-dimensional PCA basis 220 does not meet the dimensionality criterion or the compression criterion, the compression circuitry 100 may determine not to include the PCA basis computation as part of compressing the spectral reflectance dataset 201. In some implementations, the compression circuitry 100 may likewise determine not to compress the spectral reflectance dataset 201 using the PCA basis computation when the compression circuitry 100 cannot determine a dimensionality O that meets the specified accuracy level 202. Thus, in varying the compression criterion, dimensionality criterion, accuracy criterion, or various other factors in the compression process, the compression circuitry 100 may support flexibility in emphasizing accuracy, speed, throughput, compression ratio, or other goals in compressing the spectral reflectance dataset 201.

When the compression circuitry 100 determines not to include the PCA basis computation as part of the compression process, the compression circuitry 100 may perform quantization and/or Huffman encoding to leverage data repetition in the spectral reflectance dataset 201. In that regard, the compression circuitry 100 may quantize the spectral reflectance dataset 201 (408), for example to a particular bit depth that satisfies the accuracy level 202. When the compression circuitry 100 cannot determine a quantization bit depth for the spectral reflectance dataset 201 that satisfies the accuracy level 202, the compression circuitry 100 may forego compression. In this specific instance, the compression circuitry 100 may provide an output indication that the spectral reflectance dataset 201 would not benefit from the compression sub-process performed by the compression circuitry 100. However, when quantization of the spectral reflectance dataset 201 satisfies the accuracy level 202, the compression circuitry 100 may perform a Huffman encoding process on the quantized spectral reflectance dataset to obtain a Huffman table and Huffman codes (410), e.g., specifically for the quantized spectral reflectance dataset.

The compression circuitry 100 may determine whether the Huffman table and Huffman codes for the quantized spectral reflectance dataset meet the compression criterion (412). Similar to above, the compression criterion may be satisfied when the compression ratio between data sizes is less than 1.0, e.g., when ratio between the data size of the Huffman table and codes for the quantized spectral reflectance dataset and the data size of the quantized spectral reflectance dataset itself is less than 1.0 (or any other configurable compression ratio value). When the Huffman table and Huffman codes for the quantized spectral reflectance dataset satisfy the compression criterion, the compression circuitry 100 may provide the output of the Huffman encoding as the compressed spectral reflectance data 210 (414), that is the Huffman table and Huffman codes for the quantized spectral reflectance dataset. When the Huffman table and codes for the quantized spectral reflectance dataset do not satisfy the compression criterion, the compression circuitry 100 may instead provide the quantized spectral reflectance dataset as the compressed spectral reflectance data 210 (416). In this case, the compression circuitry 100 may determine not to include the Huffman encoding as part of the compression process as doing so may not result in a compression benefit.

Returning to the PCA basis computation, the compression circuitry 100 may determine to include computation of the O-dimensional PCA basis 220 weight matrix 230 when the dimensionality and compression criterion are met by the O-dimensional PCA basis 220 and the weight matrix 230 (406). In this case, the compression circuitry 100 may quantize the weight matrix 230 (418) to obtain a quantized weight matrix 240 and perform a Huffman encoding process on the quantized weight matrix 240 (420). Through the Huffman encoding process, the compression circuitry 100 may generate a Huffman table 250 and Huffman codes 251 for the quantized weight matrix 240.

The compression circuitry 100 may determine whether the Huffman table 250 and Huffman codes 251 for the quantized weight matrix 240 satisfy the compression criterion (422). Thus, the compression circuitry 100 may compare the data size of the Huffman table 250 and the Huffman codes 251 for the quantized weight matrix 240 to the data size of the quantized weight matrix 240 itself. When the compression criterion is satisfied (e.g., when the ratio between the previously mentioned data sizes is less than 1.0), the compression circuitry 100 may provide the output of the Huffman encoding (that is, the Huffman table 250 and the Huffman codes 251 for the quantized weight matrix 240) and the O-dimensional PCA basis 220 as the compressed spectral reflectance data 210 (424). When the compression criterion is not satisfied, the compression circuitry 100 may instead provide the quantized weight matrix 240 and the O-dimensional PCA basis 220 as the compressed spectral reflectance data 210 (426).

While the above discussion provides some specific examples of how the compression circuitry 100 may flexibly and adaptively compress the spectral reflectance dataset 201, the compression circuitry 100 may apply any combination of accuracy, compression, dimensionality, or other criterion to determine which compression sub-processes to perform. Thus, the compression circuitry 100 may provide the ability to trade off accuracy, compression ratio, speed, or other configurable factors in the compression process.

Figure 5:
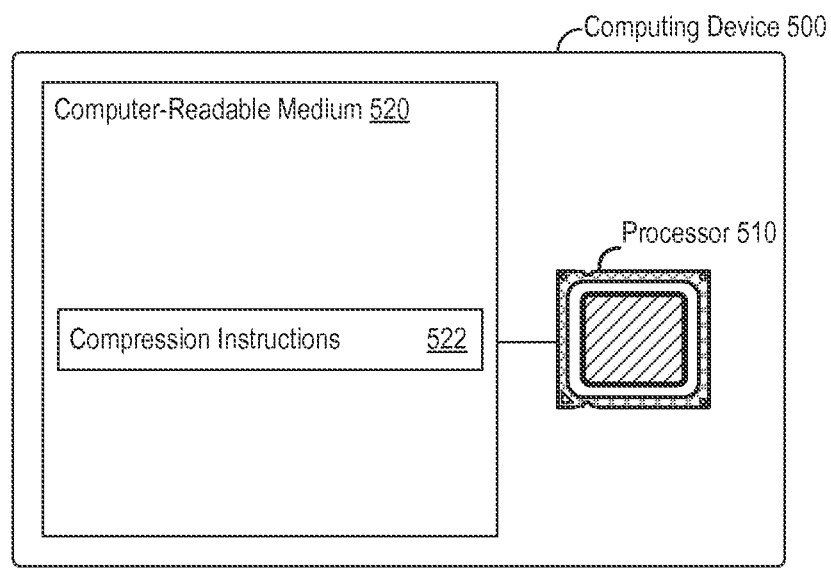
FIG. 5 shows an example of a computing device that supports compression of a spectral reflectance dataset.

FIG. 5 shows an example of a computing device 500 that supports compression of a spectral reflectance dataset. In that regard, the computing device 500 may implement any of the features described herein, including any features described above for the compression circuitry 100.

The computing device 500 may include a processor 510. The processor 510 may, for example, be central processing units (CPUs), microprocessors, and/or any hardware device suitable for executing instructions stored on a computer-readable medium (e.g., a memory). The computing device 500 may include a computer-readable medium 520. The computer-readable medium 520 may be any electronic, magnetic, optical, or other physical storage device that stores executable instructions, such as the compression instructions 522 shown in FIG. 5. Thus, the computer-readable medium 520 may be, for example, Random Access Memory (RAM), an Electrically-Erasable Programmable Read-Only Memory (EEPROM), a storage drive, an optical disk, and the like.

The computing device 500 may execute instructions stored on the computer-readable medium 520 through the processor 510. Executing the instructions may cause the computing device 500 to perform any of the features described herein. One specific example is shown in FIG. 5 through the compression instructions 522. Executing the compression instructions 522 may cause the computing device 500 to perform any combination of the functionality of the compression circuitry 100 described above, for example to compress a spectral reflectance dataset 201 that meets an accuracy level 202 by computing a PCA basis 220 for the spectral reflectance dataset 201 to identify a dimensionality O for the PCA basis 220 that satisfies the accuracy threshold and projecting the spectral reflectance dataset 201 onto the PCA basis 220 computed for the spectral reflectance dataset 201 to obtain a weight matrix 230.

In this example, when the PCA basis 220 with dimensionality O meets a dimensionality criterion and when the PCA basis 220 with dimensionality O and the weight matrix together meet a compression criterion, execution of the compression instructions 522 may cause the computing device 500 to quantize the weight matrix 230 to obtain a quantized weight matrix 240; and perform a Huffman encoding process on the quantized weight matrix 240 to generate a Huffman table 250 and Huffman codes 251 for the quantized weight matrix 240. When the Huffman table 250 and Huffman codes 251 for the quantized weight matrix 240 meet the compression criterion, execution of the compression instructions 522 may cause the computing device 500 to provide, as compressed spectral reflectance data 210, the Huffman table 250 and Huffman codes 251 for the quantized weight matrix 240 as well as the PCA basis 220.

The methods, devices, systems, and logic described above, including the compression circuitry 100, may be implemented in many different ways in many different combinations of hardware, computer-readable instructions or both hardware and computer-readable instructions. For example, the compression circuitry 100 may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. All or part of the circuitry, systems, devices, and logic described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the description above.

The processing capability of the systems, devices, and circuitry described herein, including the compression circuitry 100, may be distributed among multiple system components, such as among multiple processors and memories, e.g. including multiple distributed processing systems. Parameters, databases, and other data structures may be separately stored and managed, may be incorporated into a single memory or database, may be logically and physically organized in many different ways, and may implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above. While various examples have been described, it will be apparent to those of ordinary skill in the art that many more examples and implementations are possible.

Some example implementations have been specifically described. Other implementations are possible.

The invention claimed is:

1. A method for compressing a spectral reflectance dataset comprising:
    computing, by a processor, a principal component analysis (PCA) basis for the spectral reflectance dataset;
    projecting, by the processor, the spectral reflectance dataset onto the PCA basis computed for the spectral reflectance dataset to obtain a weight matrix;
    quantizing, by the processor, the weight matrix to obtain a quantized weight matrix;
    performing, by the processor, an encoding process on the quantized weight matrix to generate a table and codes for the quantized weight matrix;
    in response to a determination that the table and codes for the quantized weight matrix meet a compression criterion, providing, as compressed spectral reflectance data, the PCA basis, the table, and the codes; and
    in response to a determination that the table and codes for the quantized weight matrix do not meet the compression criterion, providing, as the compressed spectral reflectance data, the PCA basis and the weight matrix.

2. The method of claim 1, wherein computing the PCA basis for the spectral reflectance dataset comprises:
    determining a particular dimension for computing the PCA basis such that the PCA basis meets a required accuracy level; and
    computing the PCA basis with the particular dimension for the spectral reflectance dataset.

3. The method of claim 1, wherein quantizing the weight matrix comprises:
    determining a particular bit depth such that the quantized weight matrix meets a required accuracy level; and
    quantizing the weight matrix to the particular bit depth.

4. The method of claim 1, wherein the encoding process performed on the quantized weight matrix is a Huffman encoding process, and the table and codes for the quantized weight matrix are a Huffman table and Huffman codes for the quantized weight matrix.

5. A system comprising:
    a processor; and
    a non-transitory computer readable medium storing instructions executable to cause the processor to compress a spectral reflectance dataset that satisfies a preconfigured accuracy level, wherein to compress the spectral reflectance dataset, the instructions are executable to cause the processor to:
    compute a principal component analysis (PCA) basis for the spectral reflectance dataset;
    project the spectral reflectance dataset onto the PCA basis computed for the spectral reflectance dataset to obtain a weight matrix;
    quantize the weight matrix to obtain a quantized weight matrix;
    perform an encoding process on the quantized weight matrix to generate a table and codes for the quantized weight matrix;
    in response to a determination that the table and the codes for the quantized weight matrix meet a compression criterion, provide, as compressed spectral reflectance data, the PCA basis, the table, and the codes; and
    in response to a determination that the table and the codes for the quantized weight matrix do not meet the compression criterion, provide, as the compressed spectral reflectance data, the PCA basis and the weight matrix.

6. The system of claim 5, wherein to compute the PCA basis for the spectral reflectance dataset, the instructions are executable to cause the processor to:
determine a particular dimension for computing the PCA basis such that the PCA basis meets the preconfigured accuracy level; and
compute the PCA basis with the particular dimension for the spectral reflectance dataset.

7. The system of claim 5, wherein to quantize the weight matrix, the instructions are executable to cause the processor to:
determine a particular bit depth such that the quantized weight matrix meets the preconfigured accuracy level; and
quantize the weight matrix to the particular bit depth.

8. The system of claim 5, wherein to provide the compressed spectral reflectance data, the instructions are executable to cause the processor to provide an indication flag as to which data combination is included as the compressed spectral reflectance data.

9. The system of claim 5, wherein the preconfigured accuracy level specifies a lossless compression of the spectral reflectance dataset.

10. The system of claim 5, wherein the instructions are executable to cause the processor to vary the preconfigured accuracy level according to a user input.

11. The system of claim 5, wherein the encoding process performed on the quantized weight matrix is a Huffman encoding process, and the table and codes for the quantized weight matrix are a Huffman table and Huffman codes for the quantized weight matrix.

12. A product comprising: a non-transitory computer-readable medium storing instructions executable by a processor to compress a spectral reflectance dataset to meet an accuracy level, wherein to compress the spectral reflectance dataset, the instructions are executable to cause the processor to:
compute a principal component analysis (PCA) basis for the spectral reflectance dataset to identify a particular dimensionality for the PCA basis that meets the accuracy level;
project the spectral reflectance dataset onto the PCA basis with the particular dimensionality computed for the spectral reflectance dataset to obtain a weight matrix;
in response to a determination that the PCA basis with the particular dimensionality meets a dimensionality criterion, and the PCA basis with the particular dimensionality and the weight matrix meet a compression criterion:
quantize the weight matrix to obtain a quantized weight matrix;
perform an encoding process on the quantized weight matrix to generate a table and codes for the quantized weight matrix;
in response to a determination that the table and the codes for the quantized weight matrix meet the compression criterion: provide, as compressed spectral reflectance data, the table and codes for the quantized weight matrix and the PCA basis with the particular dimensionality; and
in response to a determination that the table and the codes for the quantized weight matrix do not meet the compression criterion: provide, as the compressed spectral reflectance data, the PCA basis with the particular dimensionality and the weight matrix.

13. The product of claim 12, wherein the instructions are executable to cause the processor to:
in response to a determination that the PCA basis with the particular dimensionality does not meet the dimensionality criterion, the PCA basis with the particular dimensionality and the weight matrix do not meet the compression criterion, or both:
quantize the spectral reflectance dataset to obtain a quantized spectral reflectance dataset;
perform the encoding process on the quantized spectral reflectance dataset to generate a table and codes for the quantized spectral reflectance dataset; and
in response to a determination that the table and the codes for the quantized spectral reflectance dataset meet the compression criterion, provide, as the compressed spectral reflectance data, the table and the codes for the quantized spectral reflectance dataset.

14. The product of claim 13, wherein the instructions are executable to cause the processor to:
in response to a determination that the table and the codes for the quantized spectral reflectance dataset do not meet the compression criterion, provide, as the compressed spectral reflectance data, the quantized spectral reflectance dataset.

15. The product of claim 13, wherein the instructions are executable to cause the processor to quantize the spectral reflectance dataset at a particular bit depth to obtain a quantized spectral reflectance dataset that satisfies the accuracy level, the compression criterion, or both.

16. The product of claim 12, wherein the instructions are executable to cause the processor to quantize the weight matrix at a particular bit depth to obtain a quantized weight matrix that satisfies the accuracy level, the compression criterion, or both.

17. The product of claim 12, wherein the encoding process performed on the quantized weight matrix is a Huffman encoding process, and the table and codes for the quantized weight matrix are a Huffman table and Huffman codes for the quantized weight matrix.

* * * * *